United States Patent [19]

Cooper et al.

[11] Patent Number: 4,713,773

[45] Date of Patent: Dec. 15, 1987

[54] METHOD FOR DISTRIBUTING WIRE LOAD IN A MULTILAYER PACKAGE AND THE RESULTING PRODUCT

[75] Inventors: John F. Cooper, Saratoga, Calif.; Edward S. Kirkpatrick, Croton-on-Hudson; Ralph Linsker, Scarsdale, both of N.Y.

[73] Assignee: International Business Machine Corporation, Armonk, N.Y.

[21] Appl. No.: 639,570

[22] Filed: Aug. 10, 1984

[51] Int. Cl.⁴ .................. G06F 15/32; G06F 7/00
[52] U.S. Cl. ................................ 364/491; 364/488
[58] Field of Search ......................... 364/488–491, 364/148, 194

[56] References Cited

U.S. PATENT DOCUMENTS

| | | | |
|---|---|---|---|
| 3,653,071 | 3/1972 | Hill et al. | 364/491 X |
| 3,681,782 | 8/1972 | Scanlon | 364/491 X |
| 3,702,004 | 10/1972 | Eskew et al. | 364/489 X |
| 3,705,409 | 12/1972 | Brayton et al. | 364/488 X |
| 4,377,849 | 3/1983 | Finger et al. | 364/491 |

OTHER PUBLICATIONS

Science, "Optimization by Simulated Annealing", S. Kirkpatrick et al., May 13, 1983, vol. 220, pp. 671–680.
IEEE Transactions on Computer-Aided Design, "Global Wiring by Simulated Annealing, Mario P. Vecchi et al.; vol. CAD-2, No. 4, Oct. 1983.
IBM Technical Disclosure Bulletin, "Topological Affinities of Nets on a Module", G. S. Ditlow, vol. 26, No. 2, Jul. 1983.

Primary Examiner—Errol A. Krass
Assistant Examiner—H. R. Herndon
Attorney, Agent, or Firm—Sughrue, Mion, Zinn, Macpeak & Seas

[57] ABSTRACT

A method for distributing wire load among the layers of a multilayer interconnection package such that in each region of the package, the wire load is balanced among all layers and such that specified subsets of two-pin connections may be constrained to lie within the same layer.

12 Claims, 7 Drawing Figures

METHOD FOR DISTRIBUTING WIRE LOAD IN A MULTILAYER PACKAGE AND THE RESULTING PRODUCT

BACKGROUND OF THE INVENTION

Field of the Invention

The invention relates to a method of assigning electrical connections to the several layers of a multilayer interconnection package to effect a distribution of the electrical connections. More particularly, the invention relates to a method for distributing electrical connections among the layers of a multilayer interconnection package, in such a manner that the number of connections passing through each region of the package is evenly balanced among all the layers, and such that each connection or each net, comprising one or more connections, is assigned to a single layer.

Description of the Prior Art

In order to facilitate the understanding of the present invention and the prior art the following background information is provided.

The electrical connection of individual components on large or very large scale integrated circuits and interconnection packages is achieved using metallic paths between the endpoints (or pins) which are to be connected. A path between two pins is referred to as a connection. A net is a specified set of one or more connections. Generally, the connections of a net are all electrically in common; that is, there is a path joining any two pins of the net, either directly or by means of other pins of the net. The method of the present invention does not, however, require this property of electrical commonality.

The present invention is concerned with packages that contain more than one wiring layer and that are designed so that each connection is required to be routed completely within one of the layers. That is, the path for a connection passes from one pin, down to a wiring layer, then to a point beneath the other pin, still within the same wiring layer, then to the other pin. A layer typically, but not necessarily, comprises a pair of wiring planes, often referred to as 'x' and 'y' planes when the predominant direction of wiring within each plane of the layer is disposed along orthogonal 'x' and 'y' axes respectively.

In designing a multilayer interconnection package, it is necessary to specify the layer in which each connection is to be routed. The present invention provides a method that assigns each connection to a layer in such a way that wire load in each region (number and length of connections passing through the region) is evenly balanced among the layers of the package. ('Region' means a portion of the package that comprises all layers, but is limited in areal extent in the x-y plane.)

It may also be necessary or desirable to assign complete nets to layers; that is, to assign connections to layers in such a way that, for every net, all connections of the same net are assigned to the same layer. The present invention also provides a method for making such an assignment while providing evenly balanced wire load in each region of the package.

There are several reasons why assignment of complete nets to layers may be necessary or desirable. First, certain package technologies require or benefit from this constrained assignment for electrical or fabrication reasons. Second, such assignment can allow the subsequent wire routing to be done independently for each layer, even though the routing process for a connection may depend upon knowledge of the positions or routings of other connections of the same net. For example, the electrical properties of the package may have to be controlled for each net, and the routed lengths of other connections of a net may need to be known before a given connection can be routed. Third, rework or repair of the package can be facilitated if all connections of a net are wired within the same layer.

Now with respect to the prior art, several methods exist for assigning connections to layers in a multilayer package. One method is to use a sequential routing procedure. In such a method, one attempts to route a connection in a first layer without violating package design rules. If this fails, one attempts to route the connection in a second layer, etc. until a valid routing is found or the connection fails to be routed. One then proceeds to the next required connection. This can result in an imbalance between the number (and total length) of connection paths on the several layers, which can lead to a requirement for more wiring layers than would be the case according to the method of the present invention.

A second method is to randomly assign each connection to some layer, so that each connection has an equal probability of being assigned to any of the layers. This method results in regional imbalances of wire load among the layers, due to statistical fluctuations. To understand this, suppose that a total of N wires traverse a region, and that there are L layers. The average number of wires traversing the region in each layer is N/L, but the actual number of wires in each layer will deviate from N/L by a number on the order of the square root of (N/L), because of statistical fluctuations. The same result applies if we denote by N the number of wires connecting pins that lie in two specified regions. In contrast, as will be seen, the present invention distributes connections among layers in such a way that the number of connections between pins that lie in two specified regions is evenly balanced among the layers, without such statistical fluctuations.

Another method for assigning connections to layers is disclosed in a commonly-assigned, copending patent application, U.S. Ser. No. 562,754, now U.S. Pat. No. 4,615,011, issued Sept. 30, 1986, entitled: "Iterative Method for Establishing Connections and Resulting Product," by R. Linsker. The aspect of that invention that relates to assignment of connections to layers, comprises a method of initially randomly assigning to each connection a layer and an initial approximate wire routing (referred to as a global routing), then iteratively removing and rerouting each connection in turn so as to determine a new routing (and layer assignment) that minimizes certain undesirable routing characteristics at each iterative step.

Another wiring method is described by S. Kirkpatrick, C. D. Gelatt, Jr. and M. P. Vecchi, in a paper entitled: "Optimization by Simulated Annealing," Science, Vol. 220, pages 671–680, May 13, 1983; and in a paper by M. P. Vecchi and S. Kirkpatrick entitled: "Global Wiring by Simulated Annealing," IEEE Transactions on ComputerAided Design, Vol. CAD-2, No. 4, pages 215–222, October 1983. The method described therein is limited to routing using "L" and "Z" wire path shapes. It considers at each step of the routing procedure only one possible alternative wire path for a connection, and evaluates a specific penalty function equal to the sum of the squares of the numbers of wires crossing each edge of the global cell.

In contrast to the methods described above, the method of the present invention does not require that a wire routing be performed in order to determine layer assignments. Furthermore, the present invention can be used to assign connections to layers with resulting balanced wire load in each region of the package, even when all connections of each net are required to be assigned to the same layer.

Also noted is a commonly-assigned, patent application, U.S. Ser. No. 317,651, entitled: "Optimization of an Organization of Many Discrete Elements," now U.S. Pat. No. 4,495,559 issued Jan. 22, 1985, by C. D. Gelatt, Jr. and E. S. Kirkpatrick. In the method of that application, elements are initially assigned to locations, then a sequence of possible moves are considered in turn. For each move, a score is computed, and the move is made if the score for that move is negative. If the score is positive, the move is made with probability equal to the exponential of minus the ratio of the score to a number T. The value of T is first increased, then decreased gradually as the process continues. An aspect of the present invention relates to the making of a decision on a probabilistic basis, for the case in which all connections of each net must be assigned to the same layer. While this decision can be made using a random number and a T-value that decreases gradually during the process, this is not required. Even when the decision is made in this way, a plurality of possible moves are considered simultaneously, and the decision to make or not to make any of the moves is made on a different basis than in the prior art method. Furthermore, the present invention relates to connection or net assignment, and teaches the use of 'connection type' classes as a means for balancing wire load among layers; the prior art method does not relate to these issues.

SUMMARY OF THE INVENTION

According to the present invention, the wiring load in each region of a multilayer interconnection package is balanced among all layers. Each net or other desired subset of two-pin connections is assigned to a single layer. The first of the above-mentioned features improves package wireability, while the second is useful or necessary for (a) satisfying certain package technology constraints, (b) improving design efficiency, and (c) improving electrical performance.

To accomplish the balancing of wiring load, the method according to the invention uses connection types. A connection type is defined in such a way that two connections are of the same connection type if, and only if, the pins of one connection are located within the same regions of the package as are the pins of the other connection.

The utility of this definition stems from the observation that if the number of connections that join each pair of regions on the package is essentially equally distributed among the layers, then the wire load, i.e. the number of wires passing through each region of the package (once the interconnection routing has been completed), will be well-balanced among the layers. Defining connection types in this way provides a means for balancing wire load effectively, in advance of any actual approximate or exact wire routing.

It is an object of the present invention to provide a balancing of wire load among the layers of the package, by distributing the connections among the various layers so that for every connection type, the disparity in the number of connections of that connection type assigned to any of the layers is zero or one, rather than a number on the order of the square root of the average number of connections of that type.

It is another object of the invention to distribute connections among the various layers so that the disparity in the number of connections of the same connection type assigned to any of the layers is minimized subject to the constraint that, for every net, all connections of the net must be assigned to the same layer.

DESCRIPTION OF THE PREFERRED EMBODIMENTS

Figure 1A:
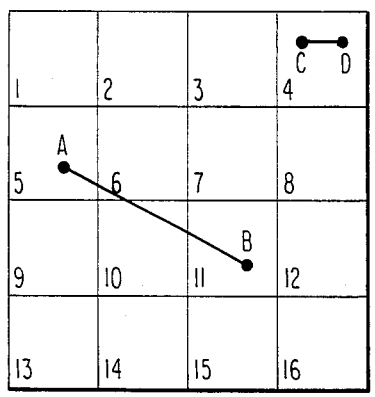
FIG. 1a is a schematic illustration of a four-by-four global grid containing two connections which are of different connection types.

In order to better understand the present invention, it is useful to consider how connection types and net types may be defined. FIG. 1a shows a four-by-four global grid defined on an interconnection package. The global grid has 16 cells in it, numbered 1 through 16. At the outset, it should be understood that the global grid with the sixteen uniform cells is used for the purpose of illustration only. It is only necessary to think of the cells as being regions of the interconnection package which contain one or more pins. A first connection AB connects a pin A in cell 5 with a pin B in cell 11. By convention, connections will be defined by referring to the lower number or earlier in sequence letter first. Assuming in this example that the connection types are referred to by cell number, the lower cell number is listed first according to the convention. Thus, connection AB may be referred to as a connection type (5, 11). For purposes of this invention, it makes no difference whether one goes from pin A to pin B or vice versa. Thus, connection (5, 11) is the same as connection type (11, 5) but both are referred to as connection type (5, 11).

Another connection CD is shown within cell 4. This will be referred to as a connection type (4, 4). In contrast to the (5, 11) connection type made between two differently-numbered cells, this connection is made within a single cell.

For a global grid comprising n regions, the number of connection types is equal to $(\frac{1}{2})(n)(n+1)$. For the present illustration, $n=16$, so there are 136 connection types.

Means for achieving balanced wire load by distributing connections among the layers such that the connections of each connection type are assigned in equal numbers to the various layers (or with a disparity of one, when the number of connections of that connection type is not evenly divisible by the number of layers), will be discussed later in connection with FIG. 2. It might be thought that when all connections of the same net are required to be assigned to the same layer, a balancing of wire load among the layers could be achieved by defining for each net a 'net type,' and distributing the nets among the layers. That is, one could consider proceeding by direct analogy with the connection assignment case, replacing 'connection' by 'net' as the basic unit being assigned.

Figure 1B:
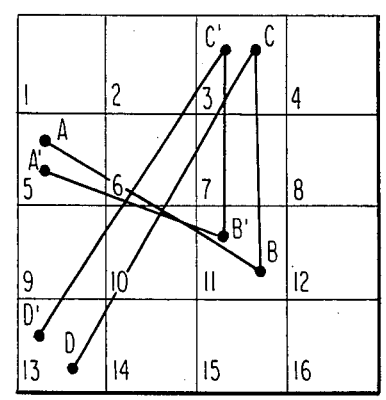
FIG. 1b is a schematic illustration of a four-by-four global grid containing two four-pin, three-connection, nets of the same net type.

This would not generally be satisfactory for the following reason. Consider FIG. 1b, in which two different four-pin nets A, B, C, D and A', B', C', and D' are shown. For the purposes of this discussion, the net type of a net is defined by the global cells containing the pins of the net. Then, the net type of each of these two nets is: (3, 5, 11, 13). With n global cells, there are $n(n-1)(n-2)(n-3)/24$ types of 4-pin nets (i.e. 1820 types for n=16), not counting net types in which two or more pins share the same global cell, and not counting nets with different connection ordering as distinct. Accordingly, any net joining the four cells 3,5,11 and 13 in order would be counted as being of the same type, by this definition. Any further refinement of the net type definition would introduce more distinct types.

Consider a large interconnection package with approximately 4000 connections. If all connection types were represented approximately equally, there would be about 4000/136 or 29 connections of each type. In contrast, there are more than 1800 types of 4-pin nets. Even if the entire connection list consisted of 4-pin or three connection nets, there would be a total of 4000/3 or 1333 connections in the package. Since there are more than 1800 connection types, the average number of nets of each net type would be less than one. Accordingly, it would generally be meaningless to think in terms of balancing net types among the several layers for such a case.

Therefore, instead of attempting to balance the wire load by defining net types, the problem is regarded as one of balancing connection types among the layers, subject to the constraint that all connections of a net must be assigned to the same layer.

Rather than defining connection type in terms of the global cells in which the pins of the connection are located, it may be more convenient to define connection type in terms of other regions, arbitrarily disposed on the package, in which the pins are located. One useful choice is to define the connection type in terms of the components mounted on the package with which the pins of the connection are associated.

Table I illustrates the determination of connection type, given a connection list each connection of which is labeled by a 'NETNAME' and by a pair of connection pins. For this illustration, it is assumed that each pin has a letter-number designation, the letter specifying the name of the component with which the pin is associated, and the number labeling a particular pin associated with that component. There are three nets comprising six connections in Table I.

TABLE I

| CONNECTION INDEX | INPUT CONNECTION PINS | NET-NAME | CALCULATE CONNTYPE |
|---|---|---|---|
| 1 | A3, D5 | NET1 | (A, D) |
| 2 | D5, B1 | NET1 | (B, D) |
| 3 | B1, C2 | NET1 | (B, C) |
| 4 | A6, D2 | NET2 | (A, D) |
| 5 | A6, B1 | NET2 | (A, B) |
| 6 | A1, D2 | NET3 | (A, D) |

With reference to the left or input side of Table I, the left column labeled "CONNECTION INDEX" simply represents a cardinal number associated with the connections in the list. The column labeled "CONNECTION PINS" simply lists the two pins making up each connection. "NETNAME" is a designation given to a net. Thus, NET1 is a three connection net from pins A3 to D5, D5 to B1 and B1 to C2. NET2 is a two-connection net from pin A6 to pin D2 and from pin A6 to pin B1. Finally, NET3 is a one connection net from pin A1 to pin D2.

Referring to the right or calculation side of Table I, it is now possible to analyze the nets to determine how many connection types there are based upon the prefix letters. On connection index line 1, it is seen that the connection extends between components A and D. The first connection type or CONNTYPE then is (A, D). On connection index line 2, the connection extends between components D and B. A second CONNTYPE (B, D) is established. (Similar to using the lower number first as was the case with the global cell examples, the convention of using the earlier in sequence letter is used.) On connection index line 3, CONNTYPE (B, C) is established. That constitutes the entire set of CONNTYPES for NET1.

Looking now at connection index line 4, which relates to NET2, it is seen that the connection extending between pins A6 and D2 have the same prefixes as the connection pins listed for NET1 on connection line index 1. The fact that the pin numbers are different is of no consequence at this point. As was the case with the global grid construction above for connection types, the concern here is with a more general area, i.e., the area beneath a component on the interconnection package rather than the particular pin within that area. Accordingly, the connection (A6, D2) of NET2 has a CONNTYPE (A, D). Moving on to connection index line 5, the second connection of NET2 extends from pin A6 to pin B1. This is a CONNTYPE (A, B). Lastly, NET3 shown on connection index line 6 is a single connection net extending from pin A1 to pin D2 making a CONNTYPE (A, D).

Figure 2:
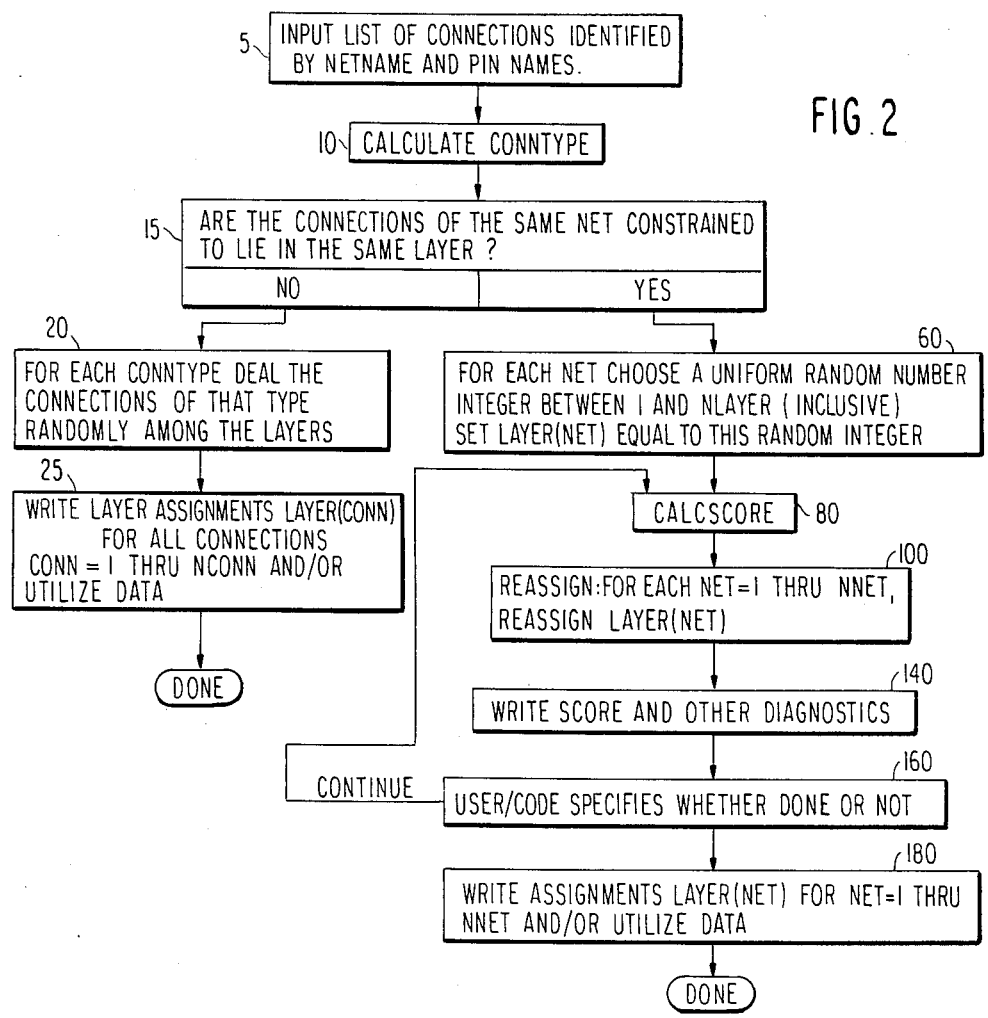
FIG. 2 is a flow diagram of a layer assignment of nets and connections according to the present invention.

FIG. 2 is a flow diagram which illustrates how the method according to the present invention maximizes balancing among the layers of an interconnection package.

To start, it is necessary to read or input the information shown in the left side of Table I. This is depicted in block 5. Next, block 10 depicts the calculation of the CONNTYPE shown on the right side of Table I.

The first inquiry, stated in block 15, asks whether the connections of the same net are constrained to lie in the same layer. Taking the simpler case first, i.e., where there is no layer constraint for the nets, the several different CONNTYPES are dealt randomly among all layers. This steps is set forth in block 20. Referring to Table I again, all CONNTYPES (A, D) would be dealt out first. Assuming that there are three layers in the interconnection package, one CONNTYPE (A, D) connection would be assigned to each layer. Similarly, all CONNTYPES are considered in turn. Since there is only one each of CONNTYPES (A, B), (B, C), and (B, D), each in turn would simply be assigned randomly to some layer. Considering each CONNTYPE, it is seen that CONNTYPE (A, D) is perfectly balanced among all three layers, whereas the other CONNTYPES have an imbalance of 1. In other words, the number of connections to CONNTYPE (A, B) is one for one of the layers and zero for the other layers. The same rationale applies to CONNTYPES (B, C) and (B, D).

Another example wherein the balancing of five connections of a given CONNTYPE are divided among three layers now will be considered. The connections would be balanced such that two layers are dealt two connections each and their remaining layer will be dealt only one connection. Again, the maximum imbalance between the layers is 1. The first two layers are in perfect balance with respect to each other and the remaining layer has one connection less than either of the first two layers.

As a variation of the step set forth in block 20, the assignment of the connections of each CONNTYPE for which the number of connections is not exactly divisible by the number of layers, can be made in such a way that the total number of connections (of all CONNTYPES) is the same for all layers, or differs by at most one for the various layers. This is an alternative to dealing the excess connection(s) of each CONNTYPE to layers at random.

When the entire list has been passed through, the layer assignments are written. These assignments will typically be utilized as input to a wire routing process, which may be used to generate art work or control a wiring machine. Upon completion of the steps shown in block 25, the process according to this aspect of the invention is completed.

Turning to the more complex case where the inquiry in block 15 results in an affirmative response, the case in which nets are constrained to lie wholly within the same layer is considered. The problem is solved by balancing connection types in a manner discussed hereinafter.

In block 60, each net is initially randomly assigned to one of N layers of the interconnection package. The following table illustrates a possible initial random assignment of the nets in three layers.

TABLE II

| NET INDEX | NETNAME | LAYER |
|---|---|---|
| 1 | NET1 | 3 |
| 2 | NET2 | 1 |
| 3 | NET3 | 1 |

The column labeled NET INDEX is similar to the connection index and is simply the row number of the table used for reference purposes. The column labeled NETNAME refers to the particular net under consideration each of which is here labeled NET followed by a number. Finally, the column labeled LAYER simply identifies the layer to which each net has been assigned. In the example shown, NET1 has been assigned to layer 3 while NET2 and NET3 have been assigned to layer 1. No nets have been assigned to layer 2.

In block 80, a quantitative measure or SCORE is associated with the assignment of the nets to the several layers. SCORE is a measure of the degree of imbalance of a particular assignment and can be compared to other SCORES. The lower the SCORE value, the more balanced the interconnection package is.

Figure 3:
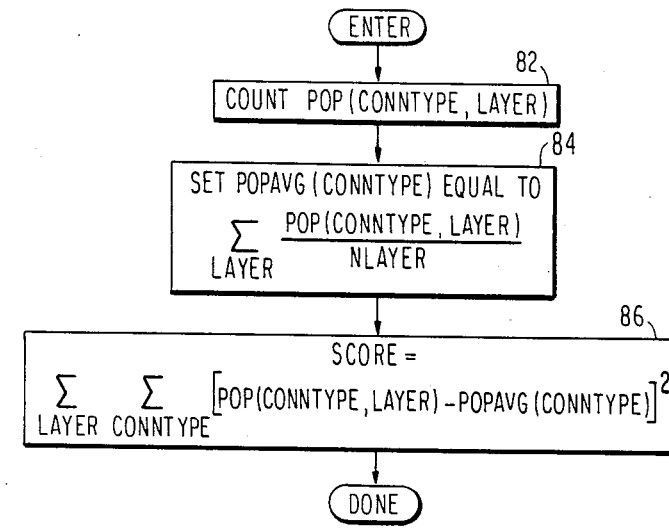
FIG. 3 is a flow diagram of a subroutine shown as a single block in FIG. 2 for calculating a SCORE value (defined hereinbelow).

With reference to FIG. 3 where the CALCSCORE subroutine is illustrated, SCORE is calculated in the following manner. For each CONNTYPE and for each layer from 1 through the last layer, NLAYER, where NLAYER represents the total number of layers, the population of that CONNTYPE in a layer is represented as POP (CONNTYPE, LAYER). The population of each CONNTYPE in each layer is counted in block 82. Then an average population of the CONNTYPE per layer, POPAVG (CONNTYPE), is determined by summing the population of each CONNTYPE in all layers and dividing the number of the total number of layers i.e., NLAYER. This may be expressed mathematically as:

$$\text{POPAVG (CONNTYPE)} = \sum_{\text{layer}} \frac{\text{POP (CONNTYPE, LAYER)}}{\text{NLAYER}}.$$

This step is shown in block 84. Finally, in block 86 the SCORE is calculated by summing the square of the quantity equal to the difference between the population of each CONNTYPE in each layer and the average population of that CONNTYPE for all layers. The sum is taken over all CONNTYPES and all layers. This is expressed mathematically as:

$$\text{SCORE} = \sum_{\text{layer}} \sum_{\text{CONNTYPE}} [\text{POP (CONNTYPE, LAYER)} - \text{POPAVG (CONNTYPE)}]^2.$$

With reference to Table I and Table II, the contribution of CONNTYPE (A,D) to the score will be calculated for purposes of illustration:

POP (CONNTYPE, layer 1) = 2

POP (CONNTYPE, layer 2) = 0

POP (CONNTYPE, layer 3) = 1

POPAVG (CONNTYPE) = $\frac{3}{3}$ = 1

(Contribution to SCORE) = $(2 - 1)^2 + (0 - 1)^2 + (1 - 1)^2$

= 2

It can readily be seen that if the connections had been distributed evenly among the three layers the SCORE would be equal to zero, indicating perfect balancing of the connections of that CONNTYPE.

When the subroutine depicted in block 80 is done, the next step, shown in block 100, is to reassign nets from the present layer to any other layers to which they may be permissibly assigned. For reasons specific to a particular design, assigning certain nets to one or more of the other layers may sometimes not be permissible. In cases where some nets are not permitted to be moved, they should be omitted from the NET loop in FIGS. 4a and 4b. When a net is not permitted to be moved to a particular NEWLAYER, the WEIGHT for that net and that NEWLAYER should be set equal to zero at block 108. Otherwise, the flow diagrams apply without change.

Figure 4A:
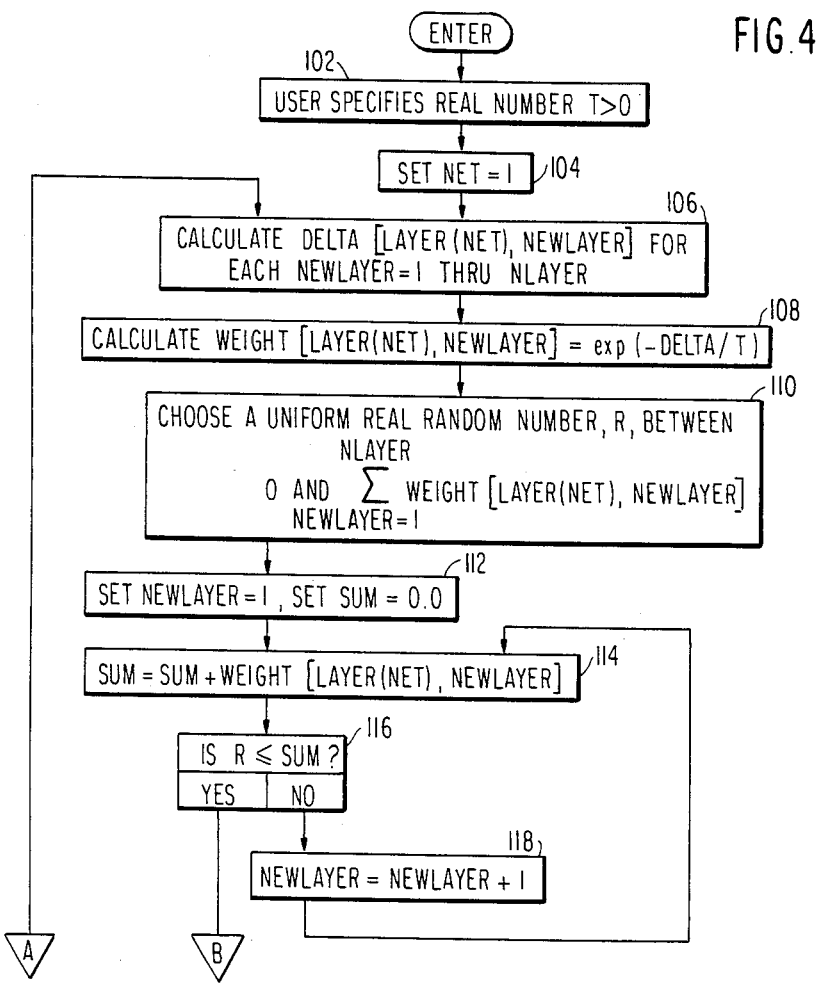
FIGS. 4a and 4b taken together constitute a flow diagram of a subroutine shown as a single block in FIG. 2 for reassigning nets from an initially assigned layer to one or more layers in which the nets aare permitted to be assigned.
Figure 4B:
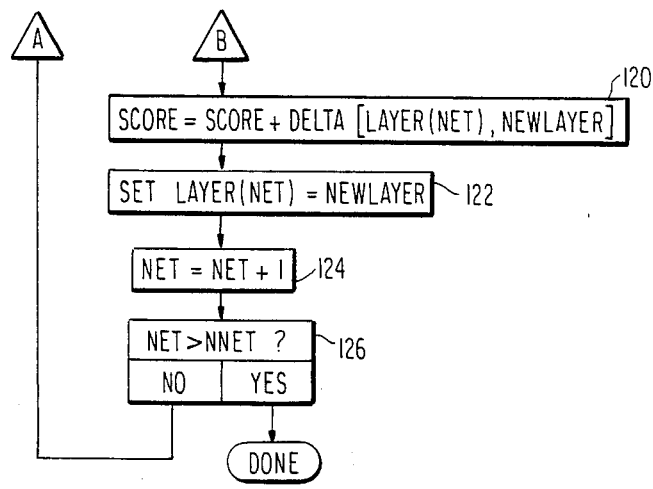

FIGS. 4a and 4b show the details of the REASSIGN subroutine. In block 102, the user specifies some real number for the value T. Practice has shown that is useful to start with a value for T which is at least several times larger than the largest value encountered for DELTA, as will be discussed hereinbelow. By running through the REASSIGN subroutine several times the value of T may be decreased with each loop. If one starts with a value for T that is too low or if one starts high and decreases it too rapidly with each loop, an undesirably large SCORE (i.e., large measure of imbalance) may result.

In block 104 the value of NET is simply set equal to 1 so that on subsequent passes through the loop all movable nets will be considered. In block 106, the DELTA value is calculated as will be described hereinbelow in detail in connection with FIG. 5. The DELTA value is a measure of whether reassigning a net to another layer results in a more balanced interconnection package. The expression for DELTA is so chosen that DELTA plus the value of SCORE prior to a reassignment of a net to a new layer, equals the value of SCORE following such reassignment. This is expressed mathematically as:

NEW SCORE=OLD SCOORE+DELTA [LAYER(NET), NEWLAYER].

The value of DELTA for keeping the net in the same layer, i.e., not reassigning it, is 0. In the embodiment described here, the lower the algebraic value of DELTA is (i.e., the less positive or more negative it is), the greater will be the probability of moving the net to the new layer corresponding to that value of DELTA. The net is not simply assigned to the new layer having the most negative value of DELTA at every step, since by so doing it is found to lead to a final assignment that can be far from optimal.

Thus, there may be several alternative layer reassignments for a given net and it is necessary to make a decision between the alternative layers. As mentioned above there exists some probability associated with each alternative reassignment that the net will be moved to a given alternative layer. In block 108, a probability factor or weight is calculated for each DELTA value. The weight is mathematically expressed as follows:

WEIGHT [LAYER(NET), NEWLAYER]=exp (−DELTA/T).

In other words, the weight represents a number associated with the probability of reassigning a net from one layer, LAYERNET, to a different layer, NEWLAYER, which is an exponential function based on the values of a calculated DELTA and a user specified value of T.

In block 110, a random real number, R, is chosen lying between zero and the sum of the weights over all values of NEWLAYER.

In block 112, the value of NEWLAYER is set equal to 1 at the start of the loop so that all potential reassignments of the net to other layers are considered. Also, the value of SUM is set equal to 0. Intervals are established as follows, the length of each interval being equal to the value of WEIGHT for each NEWLAYER=1 through NLAYER.

In block 114, the sum of the previous sum value and the weight is added. If R is not less than or equal to the sum as determined in block 116, the next step is to add 1 to the value of NEWLAYER as shown in block 118. Then, it is necessary to loop back to block 114 to recalculate the sum for the next layer to which the net may be reassigned.

Eventually, the value of the sum will be equal to or greater than R. The net is reassigned to the current value (within the loop) of NEWLAYER, and a change of SCORE is calculated in block 120 to determine SCORE for the net in its reassigned layer. NEWLAYER may of course happen to equal LAYER(NET). In that case, no layer reassignment occurs.

The value of LAYER(NET) will be set equal to (NEWLAYER) in block 122 and the NET index will be increased by 1 in block 124.

In block 126, it is determined if NET is greater than the number of nets, i.e., NNET. If so, then all the nets have been considered. If NET is not greater than NNET then it is necessary to look at the next net and consider the layers, to which it may be reassigned.

Figure 5:
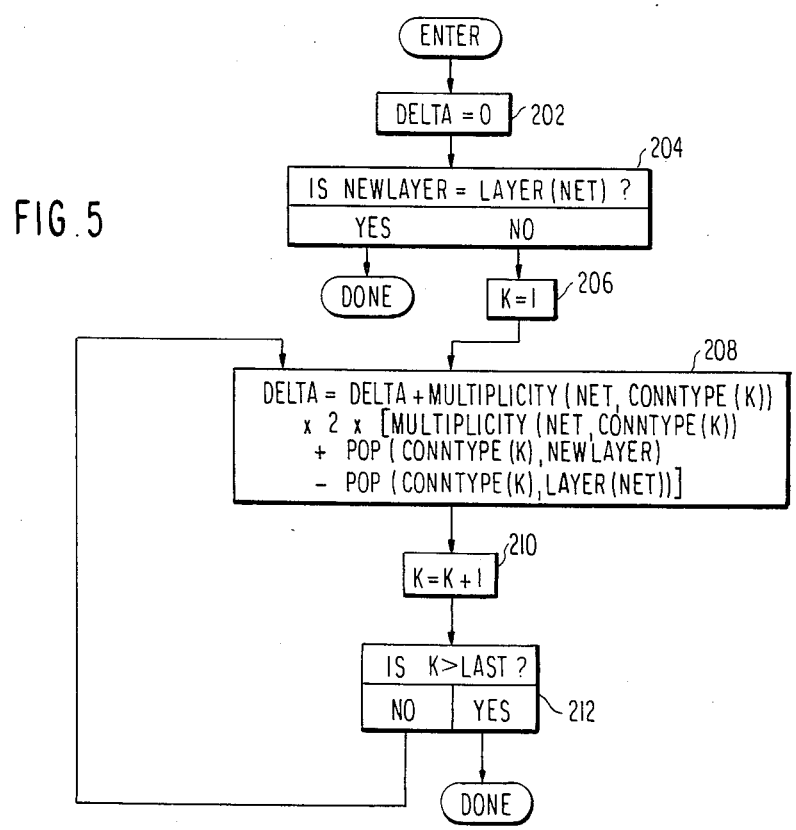
FIG. 5 is a flow diagram of a subroutine shown as a single block in FIG. 4a for calculating a DELTA value (defined hereinbelow).

With reference to FIG. 5, the derivation of the DELTA value now will be discussed. The subroutine of FIG. 5 is called once for each net and each value of NEWLAYER. The value of DELTA is set to zero in block 202. At block 204 it is determined whether the new layer, NEWLAYER, to which the net is to be assigned is the same as the layer it presently is in, i.e., LAYER(NET). If it is, then the DELTA value remains unchanged and is equal to zero. If, however, the NEWLAYER value does not equal LAYER(NET), it will be necessary to begin a loop to recalculate DELTA by setting the value of K to 1 which is done in block 206. K indexes the rows of a table that is maintained for each net, and is illustrated in Table III for the case of NET1, a net defined in Table I. The contribution to the value of DELTA resulting from the Kth entry of this table is calculated in block 208. The contribution is:

MULTIPLICITY (NET, CONNTYPE (K)) × 2 ×

[MULTIPLICITY (NET, CONNTYPE (K) +

POP (CONNTYPE(K), NEWLAYER) −

POP(CONNTYPE(K), LAYER(NET))].

MULTIPLICITY refers to the number of connections of a given CONNTYPE in a given net. Referring to Table I, the MULTIPLICITY of the connections in NET1 is depicted in the following table:

TABLE III

| K | CONNTYPE | MULTIPLICITY |
|---|----------|--------------|
| 1 | (A, D)   | 1            |
| 2 | (B, D)   | 1            |
| 3 | (B, C)   | 1            |

The K is simply an index value for convenience of reference to the values in the table. It is seen that the MULTIPLICITY for all CONNTYPES in NET1 is one. In principle, one can have multiple connections of the same CONNTYPE for a given net. MULTIPLICITY simply takes account of that possibility.

The first entry into block 208 calculates the contribution of the K=1 row of the MULTIPLICITY table to the value of DELTA. The K value is increased by one at block 210. If all K values have been considered, K>LAST and the subroutine is complete. If not, block 208 is re-entered and the contribution of the next row indexed by K is added to DELTA.

The calculation of DELTA is illustrated for the case in which moves of NET1, from the layer 3 to which it was originally assigned, are being evaluated. If NEWLAYER equals 3, it is known that DELTA is equal to zero. Now, DELTA is calculated for moving NET1 from layer 3, LAYER(NET), to NEWLAYER, for the case in which NEWLAYER=2.

$$\text{DELTA} = 1 \times 2[1 + 0 - 1]$$
$$+ 1 \times 2[1 + 0 - 1]$$
$$+ 1 \times 2[1 + 0 - 1]$$
$$= 0$$

The top three lines of the right-hand expression are the contributions from the three passes through block 208, for K=1, 2, and 3 respectively.

This result can be compared to that for moving NET1 from layer 3 to NEWLAYER=1.

$$\text{DELTA} = + 1 \times 2[1 + 2 - 1]$$
$$+ 1 \times 2[1 + 0 - 1]$$
$$+ 1 \times 2[1 + 0 - 1]$$
$$= 4$$

The difference in DELTA between the two layer assignments can be understood with reference to Table I and Table II. NET1 consists of connections of CONNTYPES (A,D), (B,D), and (B,C). Moving NET1 from layer 3 to layer 2 does not affect the SCORE, since all connections of those CONNTYPES that were formerly in layer 3 are simply shifted to layer 2. However, moving NET1 from layer 3 to layer 1 does increase the SCORE, since an additional connection of CONNTYPE (A,D) is thereby placed in layer 1, which already has two such connections. The change in SCORE is equal to DELTA, which=4.

It is understood that the loop shown in FIGS. 4a and 4b should be performed a number of times to optimize the SCORE. T should be selected such that it is initially at least three or four times the largest value of DELTA. On successive passes through this loop, T should be reduced, e.g., to 80% or 90% of its value on the preceding pass, and layer reassignment performed for each net. After T has been reduced substantially, and the SCORE appears to be converging to a low number, a final pass may be performed in which T is set equal to an essentially zero value (e.g., 0.001). This may drive down the value of SCORE even more. The value of MAXIMBALANCE provides a direct indication of how imbalanced is the layer assignment of the most imbalanced CONNTYPE. MAXIMBALANCE is defined mathematically as:

$$\text{MAXIMBALANCE} = \max_{\text{CONNTYPE}} \{\max_{\text{layer}} [\text{POP (CONNTYPE, LAYER)}] - \min_{\text{layer}} [\text{POP (CONNTYPE, LAYER)}]\}.$$

The method according to the invention examines each CONNTYPE, in sequence. For each CONNTYPE that is examined, it determines the population of that CONNTYPE in each layer. IMBALANCE is defined as the number of connections of that CONNTYPE in the layer containing the largest number of such connections minus the number of connections of that CONNTYPE in the layer containing the smallest number of sucn connections. MAXIMBALANCE is the maximum value of IMBALANCE taken over all CONNTYPES. If MAXIMBALANCE is 0 or 1, the layer assignment is as balanced as is possible for the given net list. (Further reassignment cannot possibly reduce a MAXIMBALANCE of 1 to zero.)

Referring to FIG. 2, after the REASSIGN loop is completed, the SCORE and any other diagnostics such as MAXIMBALANCE are written as shown in block 140. At that point, the user either manually or by coded instruction must determine if the SCORE and/or MAXIMBALANCE values are satisfactory. This is illustrated in block 160. If these values are not satisfactory, it will be necessary to return to block 80 and begin to perform another reassignment pass perhaps with a different value for T, as mentioned above. If the SCOORE and/or MAXIMBALANCE values are satisfactory, then the layer assignments are written for all nets is shown in block 180. This data typically may be utilized for subsequent wire routing, which will yield detailed path information used to generate artwork or to control physical wiring equipment.

The Appendix hereto presents a programming implementation of the method of FIG. 2. This implementation is written in FORTRAN for use with an IBM 370 computer. Implementation of the method of FIG. 2 in the program presented in the Appendix will be readily apparent to one having ordinary skill in the art, and is therefore not described. further.

APPENDIX

```
C   FORTRAN PROGRAM TO ASSIGN NETS TO LAYERS OF MULTILAYER PACKAGE.
C
C   INPUT: UNIT 1: CONNECTION LIST SORTED ALPHABETICALLY BY NETNAME.
C                  (X,Y) COORDINATES OF PINS OF EACH CONNECTION ARE
C                  PROVIDED.
C          UNIT 2: CONTROL INFO TO PROGRAM.
C          UNIT 3: LIST OF CONNECTIONS (IF ANY) WITH PREASSIGNED LAYER
C                  (THESE ARE 'CLOCK NETS' IN PRESENT APPLICATION).
C
C   OUTPUT: UNIT 6: TERMINAL OUTPUT DURING RUN, INCL. SCORE ('ENERGY')
C                   AND IMBALANCE INFO AFTER EACH PASS.
C           UNIT 9: INFO ON CONNECTION-TYPE LOAD IMBALANCE.
```

```
C           UNIT 10: LIST OF LAYER ASSIGNMENTS FOR EACH NET IN SEQUENCE.
C           UNITS 11 THRU 10+NUMBER OF LAYERS:
C                     CONNECTION LIST FOR EACH LAYER
C
C  PROGRAM DESCRIPTION:
C  CONNECTION TYPE CALCULATED FOR EACH CONNECTION, BASED ON (X,Y)
C  COORDINATES OF PINS.
C  LIST IS CREATED (FOR EACH NET) OF EACH CONNECTION TYPE,
C  AND THE NUMBER OF CONNECTIONS OF THAT TYPE, ON EACH NET.
C  THEN EACH NET IS ASSIGNED TO A LAYER (PLANE PAIR) (1 THRU NPP).
C  ITERATIVE RE-ASSIGNMENT OF LAYER IS THEN DONE TO NEAR-OPTIMIZE
C  SCORE FUNCTION.
C
        IMPLICIT INTEGER(P,X,Y)
C  DIMENSION OF XBD,YBD .GE. NMX,NMY=NR GLOBAL CELLS EACH DIRECTION.
C                TALLY .GE. NMX*NMY.
C                ITRIAN .GE. NMX*NMY.
C                NCONN,NDCONN,PL,ICLFLG,RANVEC .GE. NNETS=NR OF NETS.
C                LDIFF .GE. ICTMAX.
C                PIN .GE. NUMBER OF CLOCK NETS.
C       DIMS OF  IC,NCTYPE,ICTYPE = (NNETSX .GE. NNETS;
C                                   .GE. MAX NR CONNS ON A NET).
C                LOAD = (ICTXXX .GE. ICTMAX;
C                        .GE. NPP).
C                CLNAME = (MAX NR OF RECORDS IN CLOCK NET FILE; 4).
C
        INTEGER XBD(10),YBD(10),ITRIAN(100),
       - TALLY(100),
       - NAME(4),NUNAME(4),REC(20),CLNAME(1000,4),PIN(1000),
       - NCONN(10000),NDCONN(10000),PL(10000),ICLFLG(10000),
       - ICTYPE(10000,10),NCTYPE(10000,10),IC(10000,10),
       - LOAD(1000,6),LDIFF(1000)
C
        REAL RANVEC(10000)
C
        DATA BLANK/'    '/,ICTXXX/1000/,NNETSX/10000/
C
        DO 8002 I=1,100
 8002   TALLY(I)=0
C
C  READ GLOBAL CELL INFO AND NUMBER OF PLANE-PAIRS, AND WHETHER
C  CLOCKNET PLANE-PAIR ASSIGNMENTS ARE TO BE FIXED BY INPUT (ICLFIX=1)
C  OR RE-ASSIGNED (ICLFIX.NE.1).
        READ(2,*)NPP,NMX,NMY,ICLFIX
        READ(2,*)(XBD(ITEM),ITEM=1,NMX)
        READ(2,*)(YBD(ITEM),ITEM=1,NMY)
        WRITE(6,7003)NPP,NMX,NMY,ICLFIX
C  YES, CLOCK NET.
C  IF NEW NET, FLAG IT AS A CLOCK NET (VECTOR ICLFLG).
 7003   FORMAT(' NPP,NMX,NMY,ICLFIX=',4I5)
        WRITE(6,8881)(XBD(ITEM),ITEM=1,NMX)
        WRITE(6,8882)(YBD(ITEM),ITEM=1,NMY)
 8881   FORMAT(' XBD=',5I5)
 8882   FORMAT(' YBD=',5I5)
C  READ CLOCK NET INFO (AND PP INFO (CALLED 'PIN') IF DESIRED):
        ICL=1
 660    READ(3,661,END=662)(CLNAME(ICL,L),L=1,4),PIN(ICL)
```

```
661   FORMAT(2A4,A1,A2,I1)
CTEM - FOR TEST ONLY
C     PIN(ICL)=2
CENDTEM
      ICL=ICL+1
      GO TO 660
662   NCL=ICL-1
      WRITE(6,664)NCL
664   FORMAT(I5,' CLNETS RECORDS READ.')
C INITIALIZE TRIANGULAR ARRAY STRUCTURE FOR LATER COMPUTING CONN TYPE.
      IGMAX=NMY*NMX
C ICTMAX=TOT NUMBER OF DIFFERENT TYPES OF CONNECTIONS.
      ICTMAX=(IGMAX*(IGMAX+1))/2
      ITRIAN(1)=0
      DO 100 K=2,IGMAX
100   ITRIAN(K)=ITRIAN(K-1)+IGMAX+2-K
C READ SPIN FILE (NET NAME, XA,YA, XB,YB).
C ASSIGN PLANE-PAIR P IN ROTATION.
      I=0
      P=1
      DO 3 L=1,4
3     NAME(L)=BLANK
C
2     READ(1,10,END=20)(NUNAME(L),L=1,4),XAT,YAT,XBT,YBT
      IF(XAT.LE.0.OR.YAT.LE.0.OR.XBT.LE.0.OR.YBT.LE.0)GO TO 840
C FMT FOR NETS FILE (E.G., ABP1A2 NETS)
10    FORMAT(2A4,A1,A2,9X,2I4,8X,2I4)
C POSSIBLE NEW NET?
      DO 5 L=1,3
      IF(NUNAME(L).NE.NAME(L))GO TO 720
5     CONTINUE
      IF(NUNAME(4).EQ.NAME(4))GO TO 15
C CHARS 1-9 ARE SAME AS PREVIOUS NET, BUT 10-11 ARE DIFFERENT.
C IF THIS IS FOUND TO BE A CLOCK NET,
C THEN IT COUNTS AS 'SAME' AS PREVIOUS
C NET; I.E., IT MUST BE PLACED IN SAME PLANE PAIR, AND THIS PGM
C TREATS IT AS IF IT WERE SAME AS PREV NET.
C NUFLAG=0 MEANS NET HAS NOT YET BEEN CLASSIFIED AS NEW OR 'SAME'.
      NUFLAG=0
      GO TO 730
C THIS NET IS NEW; FLAG IT AS SUCH.
720   NUFLAG=1
C
C IS THIS NET A CLOCK NET?
730   IF(NCL.EQ.0)GO TO 7
      DO 620 ICL=1,NCL
      DO 630 L=1,4
      IF(NUNAME(L).NE.CLNAME(ICL,L))GO TO 620
630   CONTINUE
C YES, CLOCK NET.
C IF NEW NET, FLAG IT AS A CLOCK NET (VECTOR ICLFLG).
C IF 'SAME' AS PREVIOUS NET (THOUGH DIFFERING IN COLS 10-11), GO TO 15.
C (NOTE: TWO CLOCK NETS OF DIFFERENT NAME, BUT THAT ARE TREATED AS
C 'SAME' NET, GET ONLY ONE I-INDEX.)
      IF(NUFLAG.EQ.0)GO TO 15
      ICLFLG(I+1)=1
      GO TO 7
```

```
620   CONTINUE
C  NOT A CLOCK NET; HENCE NEW.
      ICLFLG(I+1)=0
C
C  NEW NET.
7     IF(I.GT.0)NCONN(I)=J-1
      I=I+1
      DO 9 L=1,4
9     NAME(L)=NUNAME(L)
      J=1
      PL(I)=P
C  IF ICLFIX=1, INPUT PP ('PIN') OVERRIDES RANDOMIZATION FOR CLOCK NETS.
      IF(ICLFIX.EQ.1.AND.ICLFLG(I).EQ.1)PL(I)=PIN(ICL)
      P=P+1
      IF(P.GT.NPP)P=1
C  DONE WITH NEW-NET SETUP.
C
C  FOR THIS CONNECTION, CALC GLOBAL CONNECTION TYPE.
C  XBD(1 THRU NMX)=RIGHT-EDGE COORDS OF GLOBAL CELLS.
C  SIM FOR YBD.
C
15    DO 50 XGA=1,NMX
      IF(XAT.LE.XBD(XGA))GO TO 55
50    CONTINUE
      GO TO 800
55    DO 60 XGB=1,NMX
      IF(XBT.LE.XBD(XGB))GO TO 65
60    CONTINUE
      GO TO 800
65    DO 70 YGA=1,NMY
      IF(YAT.LE.YBD(YGA))GO TO 75
70    CONTINUE
      GO TO 800
75    DO 80 YGB=1,NMY
      IF(YBT.LE.YBD(YGB))GO TO 85
80    CONTINUE
      GO TO 800
85    CONTINUE
C  COMBINE (XG,YG) INTO SINGLE VALUE FOR EACH PIN.
      IGA=NMY*(XGA-1)+YGA
      IGB=NMY*(XGB-1)+YGB
C  ORDER THE PINS OF THE CONNECTION.
      IF(IGA.LE.IGB)GO TO 90
      ITEM=IGA
      IGA=IGB
      IGB=ITEM
90    CONTINUE
C
C  TALLY NUMBER OF APPEARANCES OF PINS OF EACH GLOBAL CELL, IN
C  ENTIRE NETLIST.
C
      TALLY(IGA)=TALLY(IGA)+1
      TALLY(IGB)=TALLY(IGB)+1
C
C  COMPUTE CONNECTION TYPE, MAPPING EACH (IGA,IGB) (TRIANGULAR ARRAY)
C  INTO A SINGLE TYPE NUMBER IC(I,J).
      IC(I,J)=ITRIAN(IGA)+IGMAX-IGB+1
C  DONE WITH THIS CONNECTION
```

```
          J=J+1
          GO TO 2
 20       NNETS=I
          NCONN(NNETS)=J-1
C
C  DONE READING NETS.
C
          WRITE(80,8001)(I,TALLY(I),I=1,100)
 8001     FORMAT(' I,TALLY(I)='/100(2I5/))
C
C  FOR EACH NET, BATCH ANY IDENTICAL CONNECTION TYPES, AND COUNT NUMBER
C  OF EACH TYPE PRESENT.
C
          DO 120 I=1,NNETS
          NCONNI=NCONN(I)
          K=1
          DO 130 J=1,NCONNI
C  IS IC(I,J) A REPEAT FOR THIS NET?
          ICIJ=IC(I,J)
          IF(K.EQ.1)GO TO 145
          K1=K-1
          DO 140 KTEM=1,K1
          IF(ICIJ.EQ.ICTYPE(I,KTEM))GO TO 150
 140      CONTINUE
C  NEW TYPE
 145      ICTYPE(I,K)=ICIJ
          NCTYPE(I,K)=1
          K=K+1
          GO TO 130
C  REPEATED TYPE
 150      NCTYPE(I,KTEM)=NCTYPE(I,KTEM)+1
 130      CONTINUE
C  NOTE NDCONN = NUMBER OF DIFFERENT CONN TYPES FOR NET.
          NDCONN(I)=K-1
 120      CONTINUE
C
C  SETUP DONE.
          TEMP=-1.
          RSEED=1.
C  CALC ENERGY.
 220      CALL ETOTF(ICTYPE,NCTYPE,NNETS,NNETSX,NDCONN,PL,NPP,LOAD,
         -  ICTMAX,ICTXXX,ETOT,MAXDIF)
          IF(TEMP.GT.0.)GO TO 225
C  FIRST PASS.
          WRITE(6,205)ETOT,MAXDIF
 205      FORMAT(' ETOT=',E10.3,'; MAXDIF=',I5/
         - ' START OPTIMIZATION PASS; ENTER TEMP (T) VALUE.')
          GO TO 207
C  READ NEW T VALUE.
 225      WRITE(6,200)TEMP,ETOT,MAXDIF
 200      FORMAT(' FOR T=',F10.3,', ETOT=',E10.3,', MAXDIF=',I5/
         - ' ENTER NEW T VALUE. (.LE.0. TO STOP).')
 207      READ(5,*)TEMP
          IF(TEMP.LE.0.)GO TO 300
C  DO RE-ASSIGNMENT ONCE FOR EACH NET.
          CALL REASSN(ICTYPE,NCTYPE,NNETS,NDCONN,PL,NPP,TEMP,RSEED,
         -  LOAD,ICTMAX,RANVEC,NNETSX,ICTXXX,ICLFIX,ICLFLG)
          GO TO 220
```

```
C  DONE.
C  WRITE PLANE-PAIR ASSIGNMENTS.
300     WRITE(10,311)(PL(I),I=1,NNETS)
311     FORMAT(80I1)
C  CALC MAX LOAD DIFFERENCE AMONG PLANES, FOR EACH CONN TYPE.
        MAXDIF=0
        DO 701 ICT=1,ICTMAX
        LDLOW=9999
        LDHI=0
        DO 702 P=1,NPP
        IF(LOAD(ICT,P).LT.LDLOW)LDLOW=LOAD(ICT,P)
        IF(LOAD(ICT,P).GT.LDHI)LDHI=LOAD(ICT,P)
702     CONTINUE
        LDIFF(ICT)=LDHI-LDLOW
701     IF(LDIFF(ICT).GT.MAXDIF)MAXDIF=LDIFF(ICT)
C  WRITE LOAD ARRAY TO UNIT9.
C  FOLLOWING FORMAT IS FOR NPP=3.
        WRITE(9,671)MAXDIF
671     FORMAT(' MAX DIFFERENCE BETWEEN LOW AND HIGH LOAD = ',I5)
        WRITE(9,670)(ICT,(LOAD(ICT,P),P=1,NPP),LDIFF(ICT),ICT=1,ICTMAX)
670     FORMAT(I5,5X,3I5,5X,I5)
C
        WRITE(6,320)
320     FORMAT(' OPTIMIZATION DONE; PLANE-PAIR ASSIGNMENTS WRITTEN.'/
       - ' ENTER 1 TO WRITE PARTITIONED FILES.')
        READ(5,*)IPART
        IF(IPART.NE.1)STOP
C
C  REWIND AND REREAD NET FILE; WRITE TO FILE CORRESPONDING TO THAT
C  PL(I) ASSIGNMENT.
        REWIND 1
        DO 330 I=1,NNETS
        NCONNI=NCONN(I)
        IOUT=10+PL(I)
        DO 340 J=1,NCONNI
        READ(1,350,END=820)(REC(L),L=1,20)
350     FORMAT(20A4)
        WRITE(IOUT,350)(REC(L),L=1,20)
C
C  IF PREVIOUSLY IDENTIFIED AS A CLOCK NET, WRITE NETNAME,PL(I) TO UNIT8
        IF(ICLFLG(I).EQ.1)WRITE(8,355)(REC(L),L=1,3),PL(I)
355     FORMAT(3A4,' => PP=',I2)
C
340     CONTINUE
330     CONTINUE
        STOP
C  ERROR MESSAGES
800     WRITE(6,801)NMX,NMY,I,J,XAT,YAT,XBT,YBT,(XBD(ITEM),ITEM=1,NMX),
       - (YBD(ITEM),ITEM=1,NMY)
801     FORMAT(' ERR MC800; NMX,NMY,I,J=',4I5,
       - /' XAT,YAT,XBT,YBT=',
       - 4I5/' XBD(1 THRU NMX), YBD(1 THRU NMY)='/10I5/10I5)
        STOP 16
820     WRITE(6,821)NNETS,I
821     FORMAT(' ERR MC820; UNEXPECTED EOF ON REWIND; NNETS,I=',2I5)
        STOP 16
840     WRITE(6,841)(NUNAME(L),L=1,4),XAT,YAT,XBT,YBT
```

```
841   FORMAT(' ERR MC840; COORD.LE.0; NUNAME, XAT,YAT,XBT,YBT='/
     -  1X,2A4,A1,A2,9X,2I4,8X,2I4)
      STOP 16
      END
C
C
      SUBROUTINE ETOTF(ICTYPE,NCTYPE,NNETS,NNETSX,NDCONN,PL,NPP,LOAD,
     - ICTMAX,ICTXXX,ETOT,MAXDIF)
      IMPLICIT INTEGER(P)
      INTEGER ICTYPE(NNETSX,1),NCTYPE(NNETSX,1),PL(1),NDCONN(1)
      INTEGER LOAD(ICTXXX,1)
      ANPP=1.0/NPP
      ETOT=0.
      DO 5 IC=1,ICTMAX
      DO 5 P=1,NPP
5     LOAD(IC,P)=0
      DO 10 I=1,NNETS
      NDCONI=NDCONN(I)
      DO 10 K=1,NDCONI
      IF(NCTYPE(I,K).LE.0)GO TO 800
10    LOAD(ICTYPE(I,K),PL(I))=LOAD(ICTYPE(I,K),PL(I)) + NCTYPE(I,K)
C
      DO 20 IC=1,ICTMAX
      AVGL=0.
      DO 25 P=1,NPP
25    AVGL=AVGL+LOAD(IC,P)
      AVGL=AVGL*ANPP
      DO 30 P=1,NPP
30    ETOT=ETOT + (LOAD(IC,P)-AVGL)**2
20    CONTINUE
C
C  CALC MAX LOAD DIFFERENCE AMONG PLANES, FOR EACH CONN TYPE.
      MAXDIF=0
      DO 701 ICT=1,ICTMAX
      LDLOW=9999
      LDHI=0
      DO 702 P=1,NPP
      IF(LOAD(ICT,P).LT.LDLOW)LDLOW=LOAD(ICT,P)
      IF(LOAD(ICT,P).GT.LDHI)LDHI=LOAD(ICT,P)
702   CONTINUE
      LDIFFA=LDHI-LDLOW
701   IF(LDIFFA.GT.MAXDIF)MAXDIF=LDIFFA
C
      RETURN
C
800   WRITE(6,801)I,K,NCTYPE(I,K)
801   FORMAT(' ERR ETOTF800; I,K,NCTYPE(I,K)=',3I10)
      STOP 16
      END
C
C
      SUBROUTINE REASSN(ICTYPE,NCTYPE,NNETS,NDCONN,PL,NPP,TEMP,RSEED,
     - LOAD,ICTMAX,RANVEC,NNETSX,ICTXXX,ICLFIX,ICLFLG)
C USES SUBROUTINE VRAND1, WHICH SUPPLIES A VECTOR RANVEC OF LENGTH
C NNETS, EACH ENTRY OF WHICH IS A UNIFORM RANDOM NUMBER BETWEEN 0
C AND 1.  INPUT IS RANDOM-NUMBER SEED RSEED.
      IMPLICIT INTEGER(P)
      INTEGER ICTYPE(NNETSX,1),NCTYPE(NNETSX,1),PL(1),NDCONN(1)
     - ,LOAD(ICTXXX,1),ICLFLG(1)
```

```
      REAL RANVEC(1)
C MAX 6 PLANE-PAIRS (NEXT DIM STATEMENT) IN THIS APPLICATION:
      REAL ECUT(6)
      CALL VRAND1(RSEED,RANVEC,1,NNETS)
      DO 30 I=1,NNETS
C DON'T OPERATE ON CLOCK NETS IF ICLFIX=1:
      IF(ICLFIX.EQ.1.AND.ICLFLG(I).EQ.1)GO TO 30
C SHIFT IS USED IF SOME DE IS VERY NEGATIVE.
      SHIFT=0.
      ECUTA=0.
      NDCONI=NDCONN(I)
      DO 40 P=1,NPP
      IF(P.EQ.PL(I))GO TO 42
      DE=0.
      DO 60 K=1,NDCONI
60    DE = DE +
     - NCTYPE(I,K)*( NCTYPE(I,K) +
     - LOAD(ICTYPE(I,K),P) - LOAD(ICTYPE(I,K),PL(I)) )
C PREV STATEMENT GIVES HALF THE ENERGY CHANGE.
      DE=DE+DE
      DET=DE/TEMP + SHIFT
      IF(DET.GT.100.)GO TO 44
444   IF(DET.LT.-100.)GO TO 46
      EXDE=EXP(-DET)
      GO TO 48
C THIS DET IS VERY NEGATIVE; INCREASE SHIFT, REVISE PREV ECUT'S TO ZERO
46    P1=P-1
      ECUTA=0.
      DO 441 PP=1,P1
441   ECUT(PP)=0.
      SHIFT=SHIFT+100.
      DET=DET+100.
      GO TO 444
C NEW=OLD PLANE:
42    EXDE=1.0
C
48    ECUTA=ECUTA+EXDE
44    ECUT(P)=ECUTA
40    CONTINUE
C CHOOSE MOVE USING WEIGHTS.
      RAN=RANVEC(I)*ECUTA
      DO 50 P=1,NPP
      IF(RAN.LT.ECUT(P))GO TO 260
50    CONTINUE
      P=NPP
260   CONTINUE
C UPDATE LOAD ARRAY.
      DO 610 K=1,NDCONI
      LOAD(ICTYPE(I,K),PL(I))=LOAD(ICTYPE(I,K),PL(I))-NCTYPE(I,K)
610   LOAD(ICTYPE(I,K),P    )=LOAD(ICTYPE(I,K),P    )+NCTYPE(I,K)
      PL(I)=P
30    CONTINUE
      RETURN
      END
```

Having thus described our invention, what we claim as new, and desire to secure by Letters Patent is:

1. In a multilayer interconnection board, a method for distributing connections comprising the steps of:

(a) reading connection data relating to the location of pins on the interconnection board at which the connections terminate;

(b) defining a connection type for each connection based on the locations of the pins of said connection; and (c) distributing connections of one or more connection types among the layers of the interconnection board such that for each of these connection types, the difference between (i) the maximum number of connections of that type distributed to any layer and (ii) the minimum number of connections of that same type distributed to any layer is less than or equal to 1.

2. In a multilayer interconnection package having a plurality of nets wherein each net is made up of one or more connections and is constrained to lie in a single layer, a method for distributing the nets among the layers comprising the steps of:

(a) reading connection data relating to the location of pins on the interconnection board at which the connections terminate;

(b) defining a connection type for each connection based on the locations of the pins of said connection;

(c) randomly assigning each net to a layer;

(d) calculating a score function based on the connection data and net layer assignments;

(e) calculating a change of score function, expressed as a value, for reassigning a net from its present layer to other layers of said multilayer interconnection package;

(f) deciding to reassign said net to one of the other layers, or to retain the present layer assignment, based on the values of said change of score function;

(g) repeating steps e and f above for all nets for which reassignment is permitted;

(h) repeating steps e through g a specified number of times;

(i) generating a data file listing layer assignments for all nets; and (j) utilizing said data file to route the nets.

3. The method of claim 2 wherein the step of calculating the score is determined in accordance with the following equation:

SCORE=ΣΣ[POP(CONNTYPE, LAYER)−PIPAVG(CONNTYPE)]² where POP (CONNTYPE, LAYER) is the number of connections of a given connection type on a given layer;
POPAVG (CONNTYPE) is the total number of connections of said given connection type over all layers, divided by the number of layers; and
the sums are over all CONNTYPES and over all layers.

4. The method of claim 2 wherein the step of calculating the change in score function, DELTA, is determined in accordance with the following equation:

NEW SCORE=OLD SCORE+DELTA[LAYER(NET), NEWLAYER]

where
OLD SCORE is a previously calculated score and

DELTA = MULTIPLICITY (NET, CONNTYPE (K)) ×

2 × [MULTIPLICITY (NET, CONNTYPE (K)) +

-continued
POP (CONNTYPE(K), NEWLAYER) −

POP (CONNTYPER(K), LAYER (NET))]

and where
MULTIPLICITY (NET, CONNTYPE (K)) is the number oof connections of a given CONNTYPE in the net being considered;
POP (CONNTYPE(K), LAYER) is the population of a given connection type on a given layer;
and the sum is over all different CONNTYPE entries, indexed by K, for this net.

5. The method of claim 2 wherein the step of deciding to reassign a net comprises the further steps of: calculating a non-negative real number, WEIGHT, for each layer wherein WEIGHT is defined in terms of the change of score function and WEIGHT increases as the change of score function decreases in algebraic value; choosing a random number; and assigning said net to one of the layers based on said random number, in such a way that the probability of assigning said net to a layer is proportional to the magnitude of said number WEIGHT for said layer.

6. The method of claim 5 wherein

WEIGHT=exp (−DELTA/T), where T is a specified positive real number, and DELTA is the change of score function for a given net and layer assignment being evaluated.

7. An interconnection package having connections assigned to layers in accordance with the method of:

(a) reading connection data relating to the location of pins on the interconnection board at which the connections terminate;

(b) defining a connection type for each connection based on the locations of the pins of said connection; and (c) distributing connections of one or more connection types among the layers of the interconnection board such that for each of these connection types, the difference between (i) the maximum number of connections of that type distributed to any layer and (ii) the minimum number of connections of that same type distributed to any layer is less than or equal to 1.

8. A multilayer interconnection package having a plurality of nets wherein each net is made up of one or more connections and is constrained to lie in a single layer, wherein said nets are assigned to layers in accordance with the method of:

(a) reading connection data relating to the location of pins on the interconnection board at which the connections terminate;

(b) defining a connection type for each connection based on the locations of the pins of said connection;

(c) randomly assigning each net to a layer;

(d) calculating a score function based on the connection data and net layer assignments;

(e) calculating a change of score function for reassigning a net from its present layer to other layers of said multilayer interconnection package;

(f) deciding to reassign said net to one of the other layers, or to retain the present layer assignment, based on the value of said change of score function;

(g) repeating steps e and f above for all nets for which reassignment is permitted;

(h) repeating steps e through g a specified number of times;

(i) generating a data file listing layer assignments for all nets; and (j) utilizing said data file to route the nets.

9. The method of claim 8 wherein the step of calculating the score is determined in accordance with the following equation:

$$SCORE = [POP(CONNTYPE, LAYER) - POPAVG(CONNTYPE)]^2$$

where POP (CONNTYPE, LAYER) is the number of connections of a given connection type, denoted "CONNTYPE", on a given layer denoted LAYER;

POPAVG (CONNTYPE) is the total number of connections of said given connection type over all layers, divided by the number of layers; and the sums are over all CONNTYPEs and over all layers.

10. The method of claim 8 wherein the steps of calculating the change in score function, DELTA, is determined in accordance with the following equation:

$$NEW\ SCORE = OLD\ SCORE + DELTA[LAYER(NET), NEWLAYER]$$

where OLD SCORE is a previously calculated score and $$DELTA = MULTIPLICITY\ (NET, CONNTYPE\ (K)) \times$$
$$2 \times [MULTIPLICITY\ (NET, CONNTYPE\ (K)) +$$
$$POP\ (CONNTYPE(K), NEWLAYER) -$$
$$POP\ (CONNTYPER(K), LAYER\ (NET))]$$

and where

MULTIPLICITY (NET, CONNTYPE (K)) is the number of connections of a given CONNTYPE in the net being considered;

POP (CONNTYPE(K), LAYER) is the population of a given connection type on a given layer;

and the sum is over all different CONNTYPE entries, indexed by K, for this net.

11. The method of claim 8 wherein the step of deciding to reassign a net comprises the further steps of:

calculating a non-negative real number, WEIGHT, for each layer wherein WEIGHT is defined in terms of the change of score function and WEIGHT increases as the change of score function decreases in algebraic value;

choosing a random number; and assigning said net to one of the layers based on said random number, in such a way that the probability of assigning said net to a layer is proportional to the magnitude of said number WEIGHT for said layer.

12. The method of claim 11 wherein $$WEIGHT = \exp(-DELTA/T),$$

where T is a specified positive real number, and DELTA is the change of score function for a given net and layer assignment being evaluated.

* * * * *